(12) United States Patent  (10) Patent No.: US 8,242,859 B2
Terakawa et al.  (45) Date of Patent: Aug. 14, 2012

(54) LINE NOISE ATTENUATOR

(75) Inventors: Takashige Terakawa, Kanagawa (JP);
Hideyuki Yamanaka, Kyoto (JP)

(73) Assignee: Groundnite Inc., Kyoto (JP)

( * ) Notice: Subject to any disclaimer, the term of this patent is extended or adjusted under 35 U.S.C. 154(b) by 187 days.

(21) Appl. No.: 12/785,792

(22) Filed: May 24, 2010

(65) Prior Publication Data

US 2011/0285482 A1   Nov. 24, 2011

(51) Int. Cl.
*H03H 7/01* (2006.01)
*H01P 1/22* (2006.01)
(52) U.S. Cl. ...................................... 333/81 R; 333/181
(58) Field of Classification Search ................ 333/81 R, 333/181, 185
See application file for complete search history.

(56) References Cited

U.S. PATENT DOCUMENTS

| 7,015,774 | B2 | 3/2006 | Terakawa et al. |
| 2003/0117814 | A1* | 6/2003 | Terakawa et al. ................ 363/39 |
| 2004/0263284 | A1* | 12/2004 | Terakawa et al. ............. 333/181 |

FOREIGN PATENT DOCUMENTS

| JP | 50-127336 | 10/1975 |
| JP | 8-265085 | 10/1996 |
| JP | 2003-198306 | 7/2003 |
| JP | 2003-258586 | 9/2003 |
| JP | 2005-20448 | 1/2005 |
| JP | 2005-020448 | 1/2005 |
| JP | 2005-323397 | 11/2005 |
| JP | 3957206 | 5/2007 |
| JP | 3-957206 | 8/2007 |

OTHER PUBLICATIONS

John D. Kraus, "Antennas" translated by Isao Tanimura, Kindai Kagaku Sha Co., Ltd., 1972, vol. 1, p. 49.
Kaneyuki Kurokawa, "Introduction to Microwave Circuit", Maruzen Company, Ltd., 1963, p. 34.

* cited by examiner

*Primary Examiner* — Stephen Jones
(74) *Attorney, Agent, or Firm* — Greenblum & Bernstein, P.L.C.

(57) ABSTRACT

To power-consume noise currents flown in power source lines, etc. in non-uniform wiring modes to such a level that noise obstructions can be suppressed by using a resistance without a capacitor that causes series resonance phenomena. It is a line noise attenuator for purifying electromagnetic environments by attenuating noise currents superimposed on a conductor line which supplies a signal power to a load from a signal power source. The conductor line operates as an antenna which receives high frequency noise currents. The conductor line has an inductor which tolerates flows of a low frequency signal power, and a resistance for changing the high frequency noise currents to heat and consuming the heat with a resistance value which is so set, with respect to a resistance value of the inductor replaced with a pure resistance value, that the high frequency noise current blocked at the inductor can be flown.

3 Claims, 7 Drawing Sheets

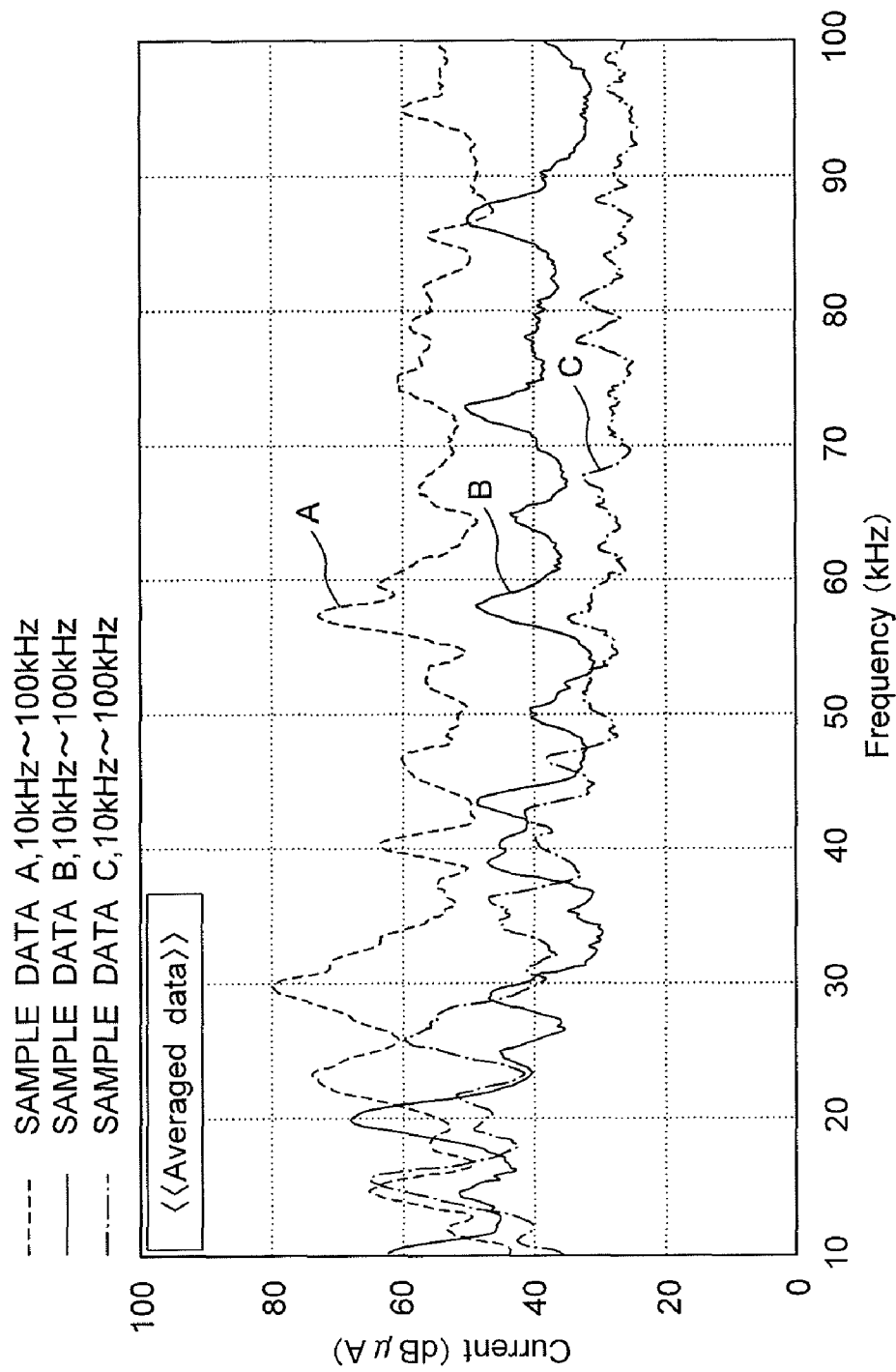

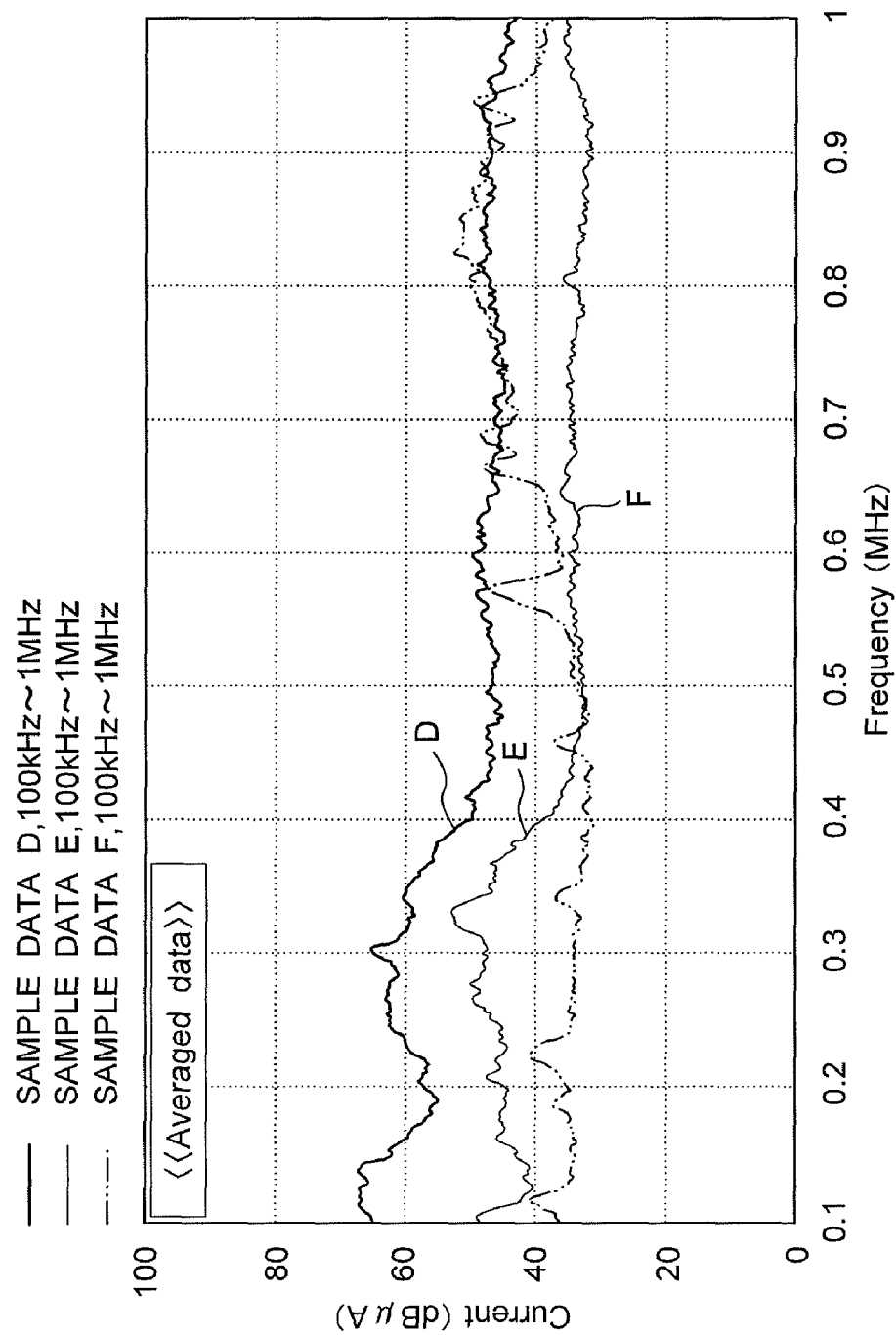

LINE NOISE ATTENUATOR

BACKGROUND OF THE INVENTION

1. Field of the Invention

The present invention relates to a line noise attenuator which purifies electromagnetic environments by attenuating noise currents superimposed on lines for supplying electric powers or signals to an electronic device from a power source or a signal source.

2. Description of the Related Art

Noise currents superimposed on conductor lines such as earth lines and power source lines connected to electronic devices mainly are common mode currents which are generated because those conductor lines operate as antennas. Regarding parallel conductor lines such as power source lines constituted with those conductor lines, wiring modes are not uniform. Those lines are drawn around by changing the directions, and a part of the common mode currents generating discontinuous points in the parallel conductor lines are converted into normal mode currents.

It is necessary to have a noise attenuator for eliminating and lightening obstructions caused due to both noise currents of common mode and normal mode superimposed on various kinds of conductor lines. Patent Document 1 discloses this type of noise attenuator.

The noise filter disclosed in Patent Document 1 is structured to prevent a resonance phenomenon with a capacitor for eliminating normal mode noise and a choke coil for suppressing harmonic currents. The noise attenuator extends passing time of input currents in a low frequency region by the choke coil to reduce a peak value of the input currents so as to suppress a harmonic component. Further, the normal noise is absorbed by the capacitor within a power source device, i.e., the noise in the normal mode is reflected upon an AC power side via the capacitor and a feedback line. Furthermore, a series resonance phenomenon of the choke coil and the capacitor is suppressed by connecting a resistance in parallel to the choke coil.

Further, Patent Document 2 discloses a double-terminal safety earth line noise filter which is attached to earth lines of electronic devices whose ground capacitances vary for each device.

Patent Document 1: Japanese Unexamined Patent Publication H8-265085

Patent Document 2: Japanese Patent No. 3957206

The noise filter disclosed in Patent Document 1 overcomes such an issue that the seventeenth to twenty-third harmonic currents exceed a limit value for satisfying the standard because of the series resonance phenomenon of the capacitor and the choke coil. Through adding a resistance to a combination of the normal mode noise eliminating capacitor and the harmonic current suppressing choke coil, the seventeenth to twenty-third harmonic currents are improved to be equal to or less than the limit value.

However, in the case of Patent Document 1, the normal mode noise is suppressed by the capacitor. Thus, voltages at both ends of the capacitor become same voltages in the case of common mode. Therefore, it is not possible with this to make a short-circuit path by the capacitor and to reflect the high-frequency noise current to the AC power source side.

Further, even though the resistance is connected in parallel to the choke coil, the resistance is for suppressing the series resonance phenomenon generated with the capacitor. Thus, the resistance value thereof is limited to a value which can suppress the series resonance phenomenon. It is true that the power is consumed by the resistance when electric currents flow into the resistance. However, the power consumption amount is set for suppressing the series resonance phenomenon. Thus, the resistance value is suppressed low. Therefore, the noise current cannot be consumed up to the value for suppressing the noise obstruction, even if the normal mode noise flows into the resistance.

Further, in Patent Document 1, inductance of the choke coil and the resistance value of the resistance are obtained based on actually measured data. Regarding the power source line, the wiring modes are not uniform as described above, and it is drawn around by changing the directions, thereby generating discontinuous points. Thus, the technique disclosed in Patent Document 1 is designed assuming that a part of the common mode noise current may be converted to normal mode noise current. When most of the noise currents are of common mode, it is not possible with the method of Patent Document 1 to reflect the noise to the AC power source side by the capacitor since the voltages at both ends of the capacitor are the same voltages as described above. Therefore, it is difficult to deal with the noise obstructions in the common mode.

Further, Patent Document 2 utilizes magnetic saturation of an inductor, and it is structured to magnetic-saturate the inductor with low-frequency currents of a large current value which flows into an apparatus and causes malfunctions to the apparatus so as to protect the apparatus by discharging the low-frequency currents to the earth, and to heat-consume the high-frequency noise small currents superimposed on the earth line with the resistance provided in parallel to the inductor. When the technique of Patent Document 2 is applied as it is to a power system, the inductor is magnetic-saturated since the low-frequency power source current flown to the conductor of the power system is of a large current value. Thus, the high-frequency noise current superimposed on the conductor flows into an apparatus without being blocked by the inductor. This results in causing malfunctions in the apparatus by the high-frequency noise current.

Therefore, in order to build the technique of Patent Document 2 as a noise filter for the power system, it is necessary to establish a design theory suited for the noise filter for the power system from a different point of view. Looking into inductors that are actually commercialized, no inductor having an inductance value required for blocking the high-frequency noise current without causing magnetic saturation has been developed. Therefore, it is necessary to develop an inductor that can overcome such issue.

SUMMARY OF THE INVENTION

An exemplary object of the present invention is to provide a line noise attenuator which power-consumes the obstructions to a level that can be eliminated by suppressing the common mode noise current flown in the power source line and the like whose wiring modes are uniform by using a resistance without using a capacitor that causes a series resonance phenomenon and without having magnetic saturation with a low-frequency signal current flown in a conductor.

In order to achieve the foregoing exemplary object, the line noise attenuator according to the present invention is a line noise attenuator for purifying an electromagnetic environment by attenuating a noise current superimposed on a conductor line which supplies a signal power to a load from a low frequency signal power source. The conductor line operates as an antenna which transmits/receives a high frequency noise current. The attenuator comprises: an inductor which tolerates current amount of a low frequency signal power; and a resistance to which the high frequency noise current blocked at the inductor can be flown, a resistance value thereof is set, with respect to a reactance value of the inductor at an angular frequency of the high frequency noise current, to a prescribed value with which the high frequency noise current is changed to heat and consumed, wherein a ratio between inductance of the inductor and the resistance value of the resistance is fixed quantitatively, and the inductor and the resistance are provided to the conductor line.

The present invention is capable of eliminating the noise current flown in a conductor line such as a power source line for supplying a signal power from a signal power source to a load by power-consuming the common mode noise current flown in the power source line, the signal line, and the like regardless whether the wiring modes are uniform or not without using a capacitor that causes the series resonance phenomenon or without having magnetic saturation with a low-frequency signal current.

BRIEF DESCRIPTION OF THE DRAWINGS

FIG. 3 is a graph showing an electromagnetic environment measured under a state where the noise attenuator according to the exemplary embodiment of the present invention is loaded;

FIG. 4 is a graph showing an electromagnetic environment measured under a state where the noise attenuator according to the exemplary embodiment of the present invention is loaded

DETAILED DESCRIPTION OF THE PREFERRED EMBODIMENTS

Hereinafter, exemplary embodiments of the present invention will be described in detail by referring to the accompanying drawings.

The foundation of the basic principle of exemplary embodiments of the present invention is that the inventors has paid an attention to the fact that conductor lines connected to an electronic device results in noise currents, when the conductor line operates as an antenna. It is the inventors of the present invention who first employed this antenna theory, and there is no prior case that has developed this. Hereinafter, explanations will be provided by referring to following literatures.

J, D, Kraus "Antennas" translated by Isao TANIMURA, Kindai Kagaku Sha Co., Ltd, 1972, Vol. 1, p. 49 (Literature 1)
Kaneyuki KUROKAWA "Introduction to Microwave Circuit" Maruzen Company, Limited, 1963, p. 34 (Literature 2)

Noise currents superimposed on conductor lines such as earth lines and power source lines connected to electronic devices mainly are common mode currents which are generated because those conductor lines operate as antennas. Regarding parallel conductor lines such as power source lines, the wiring modes thereof are not uniform, and those lines are drawn around by changing the directions. As a result, discontinuous points are generated in the parallel conductor lines and a part of the common mode currents is converted into normal mode currents.

Therefore, there is proposed a noise attenuator that is effective for eliminating and lightening obstructions caused by the noise currents of both modes superimposed on various kinds of conductor lines.

Figure 7:
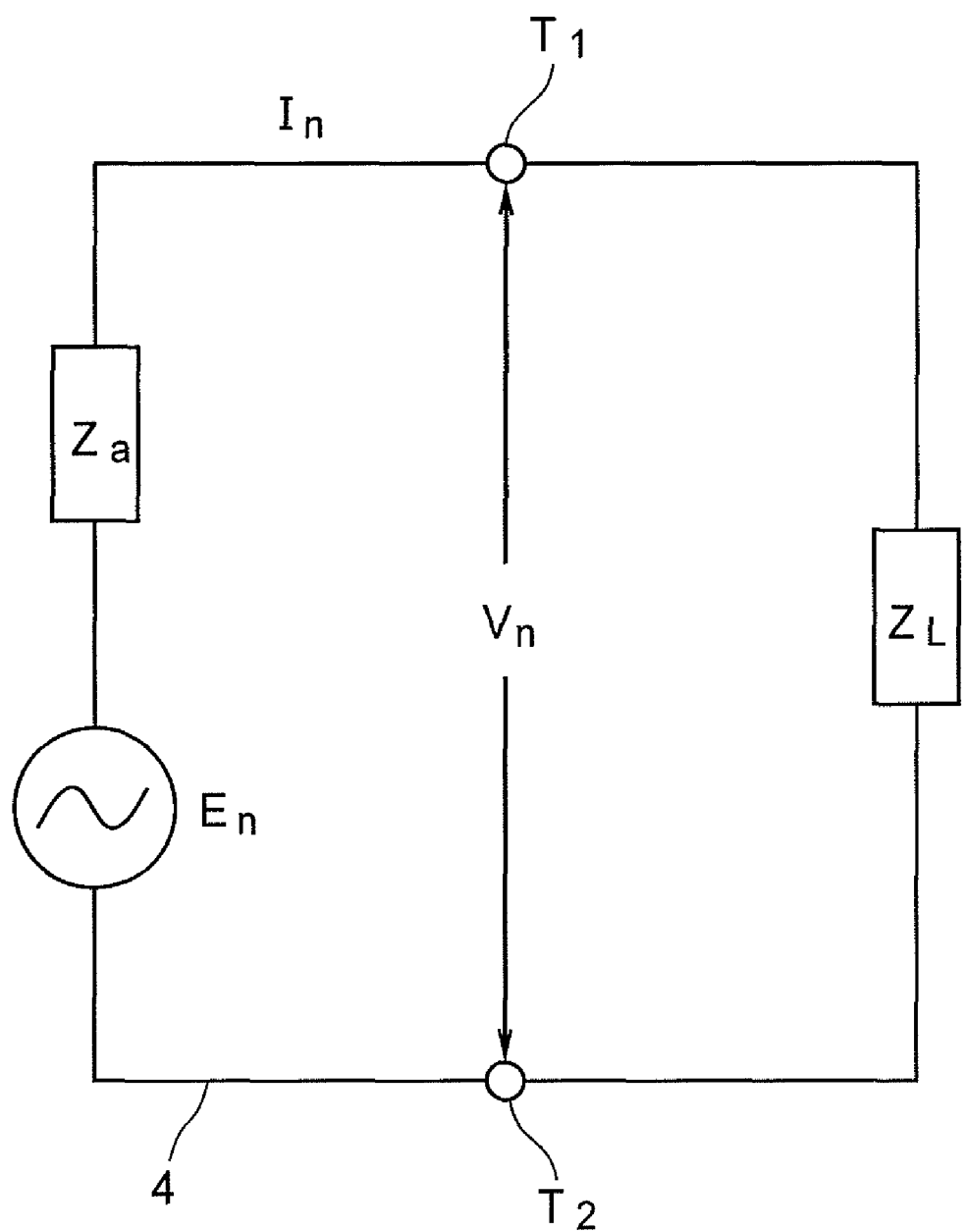
FIG. 7 is an illustration showing an equivalent circuit in a case where a conductor line operates as an antenna.

When the conductor line connected to the electronic device works as an antenna and it is a factor that results in the noise current, an equivalent circuit thereof can be shown as in FIG. 7 (Literature 1). In this case, an earth line is taken as an example of the conductor line, and a part of the conductor line forming the circuit is not a conductor but ground.

In FIG. 7, it is assumed that internal impedance of a conductor line 4 working as an antenna is "$Z_a = R_r + jX_a$", and noise obstruction load impedance of an electronic device having noise obstruction connected to the conductor line 4 is "$Z_L = R_L + jX_L$". "Noise obstruction load" herein means virtual load when the electronic device suffers malfunctions due to the noise current, and it cannot be clearly observed or measured. In general, however, stray capacitance and resistance between an electronic circuit and a power line within an apparatus casing may be considered. In that case, the energy consumed by the noise obstruction can be replaced with a single resistance. Thus, this is simply called obstruction load hereinafter, and $R_L$ is considered as the resistance of the power consumption which causes the noise obstruction.

Now, in the equivalent circuit shown in FIG. 7, assuming that noise voltage in input terminals T1, T2 of the conductor line 4 right before the electronic device obstruction load is $V_n$ and noise current is $I_n$, and when order transforming amounts of those, i.e., following formulae (1) and (2), are given (Literature 2), formula (3) can be obtained from FIG. 7 provided that the input voltage to the conductor line 4 working as the antenna is $E_n$. Thus, formula (4) can be obtained. The value expressed with formula (4) shows the maximum noise power value which generates a noise trouble.

$$a_n = \frac{V_n + I_n Z_a}{2\sqrt{\operatorname{Re} Z_a}} \quad (1)$$

$$b_n = \frac{V_n - I_n Z_a^*}{2\sqrt{\operatorname{Re} Z_a}} \quad (2)$$

$$V_n = E_n - Z_a I_n \quad (3)$$

$$|a_n|^2 = \frac{E_n^2}{4R_r} \quad (4)$$

The value shown with formula (4) indicates the maximum noise power value (commutative power value) that can be supplied to the obstruction load when the conductor lines such as the power source line and the earth line connected to the electronic device function as antennas as described above. In other words, the value shown with formula (4) is the maximum noise power the conductor line as the antenna can receive from the electromagnetic environment and the maximum value of the noise power that can cause the noise obstruction to the electronic device. It is the noise power supplied to obstruction resistance $R_L$, when "$R_r = R_L$" and "$X_a = -X_L$" apply.

Under a matching condition of "$R_r=R_L$" and "$X_a=-X_L$", "$E_n-Z_aI_n=Z_LI_n$ ∴$E_n=(Z_a+Z_L)I_n$, $Z_L=Z_a^*$" apply. Therefore, formula (2) can be expressed as formula (5), $$|b_n| = \frac{V_n - I_n Z_a^*}{2\sqrt{\text{Re}Z_a}} = \frac{E_n - (Z_a + Z_a^*)I_n}{2\sqrt{\text{Re}Z_a}} = \frac{E_n - E_n}{2\sqrt{\text{Re}Z_a}} = 0 \quad (5)$$

and $|b_n|^2$ is comprehended as the noise power that is not received by the conductor line 4 as the antenna since the conductor line 4 operating as the antenna and the obstruction load do not satisfy the above-described matching condition. It indicates that the power is "0" under the matching condition described above. That is, it indicates that all the received noise power is power-consumed by the obstruction resistance $R_L$ of the electronic device.

Now, when $(|a_n|^2-|b_n|^2)$ is solved by using formulae (1) and (2), formula (6) can be obtained. Note that $W_{nL}$ indicates the power consumed by the obstruction load resistance under a normal state (unmatched state).

$$|a_n|^2 - |b_n|^2 = \text{Re}[V_n I_n^*] \quad (6)$$
$$= |V_n|^2 \frac{R_L}{R_L^2 + X_L^2}$$
$$= \frac{(Z_a + Z_a^*)(V_n I_n^* + V_n^* I)}{4R_r}$$
$$= \frac{E_n^2 R_L}{(R_r + R_L)^2 + (X_a + X_L)^2}$$
$$= W_{nL}$$

To lighten the obstruction by the noise power means to reduce the right side $W_{nL}$ of formula (6). It is indicated that $W_{nL}$ can be reduced by inserting an inductor to the circuit.

Conventionally, in a four-terminal type filter used as a noise filter of a power source line, an inductor is structured to be effective only for the common mode noise current (see Patent Document 1). This is the same function as an operation of adding a reactance component (inductor) having an increasing characteristic for the frequency, i.e., "$X_f=\omega_n L$" to a term "$(X_a+X_L)$" of a denominator of formula (6). Note here that "$\omega_n$" is an angular frequency of the noise current, and L is inductance of the inductor.

That is, "$(X_a+X_L)^2$" in formula (6) comes to be "$(X_a+X_L+X_f)^2$", and there is obtained formula (7).

$$|a_n|^2 - |b'_n|^2 = \frac{E_n^2 R_L}{(R_r + R_L)^2 + (X_a + X_L + X_f)^2} = W'_{nL} \quad (7)$$

In order for "$W'_{nL}<W_{nL}$" to apply, it is necessary to satisfy "$(X_a+X_L+X_f)^2>(X_a+X_L)^2$". Therefore, when "$(X_a+X_L)$" is capacitive, it is necessary to employ $X_f$, i.e., inductor, with which "$X_f>-2(X_a+X_L)$" applies.

If the inductor satisfying "$X_f<-2(X_a+X_L)$" is employed as the inductor inserted to the conductor line, there is obtained "$W'_{nL}>W_{nL}$". Therefore, there causes such an issue that the measure taken thereby generates the opposite effect, i.e., an increase in the power to be consumed by the obstruction load resistance.

In the meantime, $|b_n|^2$ and $|b'_n|^2$ in formulae (6) and (7) can be expressed as in formulae (8) and (9). For "$X_f \to \infty$", formula (10) can be obtained, so that $|b'_n|^2$ is an inverse power, i.e., most of the received power is returned to the power source side via the conductor line (feedback line).

$$|b_n|^2 = \frac{E_n^2}{4R_r} \frac{(R_r - R_L)^2 + (X_a + X_L)^2}{(R_r + R_L)^2 + (X_a + X_L)^2} \quad (8)$$

$$|b'_n|^2 = \frac{E_n^2}{4R_r} \frac{(R_r - R_L)^2 + (X_a + X_f + X_L)^2}{(R_r + R_L)^2 + (X_a + X_f + X_L)^2} \quad (9)$$

$$= \frac{E_n^2}{4R_r} \frac{\left(\frac{R_r - R_L}{X_f}\right)^2 + \left(\frac{X_a + X_L}{X_f} + 1\right)^2}{\left(\frac{R_r + R_L}{X_f}\right)^2 + \left(\frac{X_a + X_L}{X_f} + 1\right)^2}$$

$$|b'_n|^2 \to \frac{E_n^2}{4R_r} \quad (10)$$

Further, when "$(|b'_n|^2-|b_n|^2)$" is solved, formula (11)

$$|b'_n|^2 - |b_n|^2 = \quad (11)$$
$$\frac{E_n^2}{4R_r}\left\{\frac{(R_r-R_L)^2+(X_a+X_L+X_f)^2}{(R_r+R_L)^2+(X_a+X_L+X_f)^2} - \frac{(R_r-R_L)^2+(X_a+X_L)^2}{(R_r+R_L)^2+(X_a+X_L)^2}\right\} =$$
$$\frac{E_n^2 R_L X_f (2X_a + 2X_L + X_f)}{\{(R_r+R_L)^2+(X_a+X_L+X_f)^2\}\{(R_r+R_L)^2+(X_a+X_L)^2\}}$$

can be obtained. When "$(X_a+X_L)$" is capacitive, "$|b'_n|^2>|b_n|^2$" applies under the condition of "$X_f>-2(X_a+X_L)$". This indicates that the obstruction power is reduced by the increase of the inverse power.

When "$R_r=R_L$" and "$X_f=-X_L$" as the antenna matching conditions are placed into formula (8), $|b_n|^2$ becomes "0". This matches the result of formula (5) without having the maximum received noise power turning into the inverse power or to the re-radiated power when the conductor line 4 functions as the antenna.

The noise obstruction reducing measure taken by inserting the inductor to various kinds of conductor lines 4 may turn out as the opposite effect as described above. Further, it only induces an increase in the inverse power, and generates no electromagnetic environment purifying effect.

Therefore, effects obtained when the inductor is replaced with a pure resistance will be described. That is, provided that "$\omega_n L \gg R$", it becomes equivalent when the inductor is replaced with the pure resistance. Comparing formula (12) with formula (7), $$|a_n|^2 - |b''_n|^2 = \frac{E_n^2(R + R_L)}{(R_r + R_L + R)^2 + (X_a + X_L)^2} \quad (12)$$
$$= \frac{E_n^2 R}{(R_r + R_L + R)^2 + (X_a + X_L)^2} +$$
$$\frac{E_n^2 R_L}{(R_r + R_L + R)^2 + (X_a + X_L)^2}$$
$$= W_{nR} + W''_{nL}$$

it is clear that "$W''_{nL}<W_{nL}$" is obtained due to the existence of the resistance R. Thus, the power consumption in the obstruction load resistance $R_L$ is decreased.

In this case, the inverse power becomes as in formula (13).

$$|b_n''| = \frac{E_n^2}{4R_r} \frac{(R_r - R_L - R)^2 + (X_a + X_L)^2}{(R_r + R_L + R)^2 + (X_a + X_L)^2} \quad (13)$$

$$= \frac{E_n^2}{4R_r} \frac{\left(\frac{R_r - R_L}{R} - 1\right)^2 + \left(\frac{X_a + X_L}{R}\right)^2}{\left(\frac{R_r + R_L}{R} + 1\right)^2 + \left(\frac{X_a + X_L}{R}\right)^2}$$

When the value of the parallel resistance R is selected to satisfy "$R \gg (X_a + X_L)$" and "$(R_r - R_L) \approx R$", $|b'_n|^2$ becomes small infinitely, and the inverse power becomes close to "0".

Further, when "$(|b'_n|^2 - |b''_n|^2)$" is solved by replacing the inductor $X_f$ with the resistance R, i.e., "$X_f = R$", formula (14) can be obtained.

$$|b'_n|^2 - |b''_n|^2 = \frac{E_n^2}{4R_r} \left\{ \frac{(R_L - R_r)^2 + (X_a + X_L + X_f)^2}{(R_L + R_r)^2 + (X_a + X_L + X_f)^2} - \frac{(R + R_L - R_r)^2 + (X_a + X_L)^2}{(R_r + R_L + R)^2 + (X_a + X_L)^2} \right\} \quad (14)$$

$$= E_n^2 \frac{R\{R_r^2 - R_L^2 + (X_a + X_L + X_f)^2\} + R_L\{X_f^2 + 2(X_a + X_L)X_f - R^2\}}{\{(R_L + R_r)^2 + (X_a + X_L + X_f)^2\}\{(R_L + R_r + R)^2 + (X_a + X_L)^2\}}$$

$$= \frac{E_n^2}{R} \frac{\left(\frac{R_r}{R}\right)^2 - \left(\frac{R_L}{R}\right)^2 + \left(1 + \frac{X_a + X_L}{R}\right)^2 + 2\left(\frac{R_L}{R}\right)\left(\frac{X_a + X_L}{R}\right)}{\left\{\left(\frac{R_r + R_L}{R}\right)^2 + \left(1 + \frac{X_a + X_L}{R}\right)^2\right\}\left\{\left(1 + \frac{R_r + R_L}{R}\right)^2 + \left(\frac{X_a + X_L}{R}\right)^2\right\}}$$

If "$R \gg R_L, R_r$" and "$R \gg |X_a + X_L|$" apply, formula (15)

$$(|b'_n|^2 - |b''_n|^2) = \frac{E_n^2}{R} > 0 \quad (15)$$

can be obtained. This indicates that a part of the noise power is consumed by the resistance R, and the inverse power, i.e., the re-radiated power is decreased than the inductor $X_f$. This decrease degree depends on formula (13).

As described above, in the exemplary embodiment of the present invention, it is verified that the noise obstruction power and the inverse power in the electronic device can be reduced by replacing the inductor with the pure resistance. However, it is required that the signal current of a prescribed power source frequency or the like flows in the power source line easily. Particularly, the signal current of a prescribed frequency needs to be flown in the signal line, so that the resistance alone cannot simply be inserted to the conductor line.

Figure 1A:
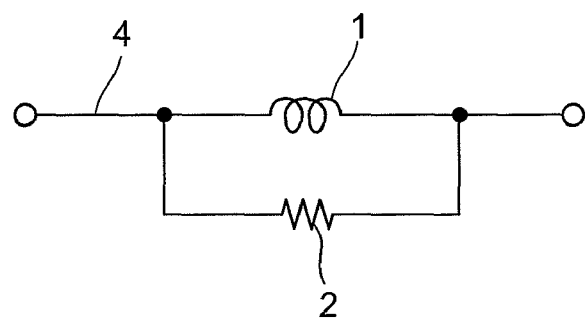
FIG. 1A is a circuit diagram showing a structure of a unit element of a line noise attenuator according to an exemplary embodiment of the present invention.

Thus, the exemplary embodiment of the present invention uses, as the basic structure, the simplest circuit element structure with which the basic frequency current (low frequency signal current) can be easily flown in the power source line that is the conductor line 4 operating as the antenna shown in FIG. 1A and with which the power consumption is given to the high frequency noise current so that it is not easily flown. That is, as shown in FIG. 1A, in the exemplary embodiment of the present invention, the inductor 1 and the resistance 2 are connected in series, and this structure is taken as the simplest circuit element structure.

With the structure as shown in FIG. 1A, it is possible to determine the inductance L of the inductor 1 and the resistance value R of the resistance 2 in such a manner that the power source frequency current (low frequency signal current) in the low frequency region flows to the inductor 1 side and the noise current (high frequency noise current) in the high frequency region flows to the resistance 2 side. For example, provided that the inductance L of the inductor 1 is 10 mH and the resistance value R of the resistance 2 is 50Ω, the inductor 1 exhibits reactance of 3Ω for the current of the power source frequency 50 Hz (low frequency signal current). Since "50Ω>>3Ω", most of the power source frequency current flows to the inductor 1 side. In the meantime, the inductor 1 exhibits reactance of about 630Ω with the high frequency noise current of 10 KHz, so that most of the high frequency noise current flows to the resistance 2 side to be consumed. Therefore, it can be considered as equivalent to having the inductor 1 replaced with the pure resistance for the high frequency noise current of 10 KHz or higher.

The exemplary embodiment of the present invention practically implements the noise attenuator by inserting the basic circuit structure shown in FIG. 1A to double power source lines.

Signal transmission in the conductor line 4 such as the signal line, e.g., the power source line, can be conducted with the so-called normal mode. Conventionally, the inductor of the noise filter used for the power source line is required to use a core member having a higher responsiveness for the high frequency. However, the core member has such a shortcoming that it is likely to cause magnetic saturation at a low current value. Thus, the conventional noise filter is structured by applying two same-turn windings to a single core to cancel magnetic fluxes with each other by reciprocating currents in order to avoid magnetic saturation. Therefore, the inductor of this case is effective only for the common mode noise current.

As depicted in balun circuits of antenna engineering, it is well known that even if it is tried to feed the power to a linear antenna under a normal mode, a part of the normal mode current is converted to a common mode at a discontinuous point of the transmission line generated in the connection part with the antenna. Therefore, in many cases, a part of the common mode noise current is converted to the normal mode at the discontinuous point such as a point where the power source line (conductor line 4) is drawn around and its direction is changed at a right angle, for example. Thus, Patent Document 1 still may have some effectiveness.

The line noise attenuator according to the exemplary embodiment of the present invention is structured to be effective for consuming the noise power and suppressing the noise current in both common and normal modes. However, an issue generated when inserting it to the signal line, particularly the power source line, is that magnetic saturation of the core member gives the limit to the effective current value.

Therefore, in the line noise attenuator according to the exemplary embodiment of the present invention, the number of windings in a single core is suppressed to the limit turn number with which magnetic saturation occurs at a prescribed signal current value, and the element obtained by combining the resistance 2 in parallel to the inductor 1 is taken as a unit element. With this, the noise attenuator capable of withstanding the prescribed current of the power source line and the like is put into practical use. The limit turn number causing magnetic saturation is determined depending on the current value flown in the conductor line, and it is not determined uniquely. Thus, the limit turn number is adjusted according to the current value.

Figure 1B:
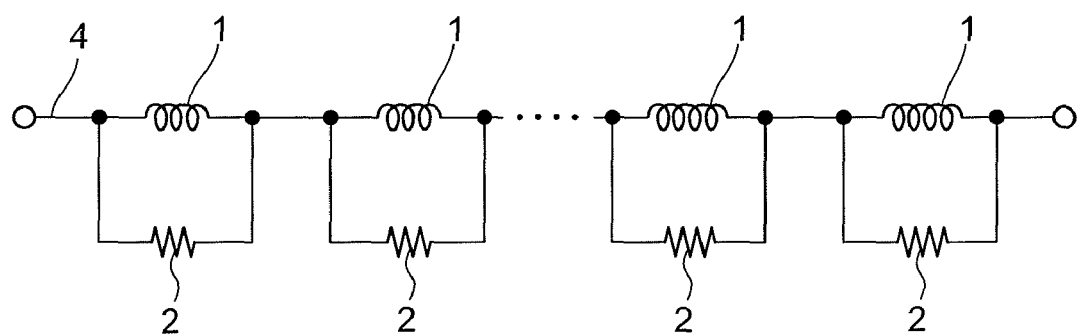
FIG. 1B is a circuit diagram showing an example where the unit elements shown in FIG. 1A are cascade-connected.

As shown in FIG. 1A, in the line noise attenuator according to the exemplary embodiment of the present invention, the inductor 1 and the resistance 2 are connected in parallel as a unit element, and such unit elements are connected in series (cascade connection) as shown in FIG. 1B. Further, the ratio of the inductance $L_i$ ($L_1, L_2, L_3, \text{---} L_n$) of the inductor 1 to the resistance value $R_i$ ($R_1, R_2, \text{---} R_n$) of the resistance 2 is fixed quantitatively.

Provided that the impedance of the i-th unit element in FIG. 1B is $Z_i$, it can be expressed as in formula (16)

$$Z_i = |Z_i| e^{j\vartheta_i} \quad (16)$$

wherein $$|Z_i| = \frac{R_i(\omega L_i)}{\sqrt{R_i^2 + (\omega L_i)^2}} \quad (17)$$

$$\vartheta_i = \arctan \frac{R_i}{\omega L_i} \quad (18)$$

Therefore, the total impedance Z obtained by the two or more unit elements that are serially connected to the power source line (conductor line 4) can be expressed as in formula (19).

$$Z = \sum_{i=1}^{n} |Z_i| e^{j\vartheta_i} \quad (19)$$

Provided that it is assumed as in formula (20), there is obtained formula (21).

$$\vartheta_1 = \vartheta_2 = \ldots = \vartheta_i = \ldots = \vartheta_n = \theta \quad (20)$$

$$Z = \sum_{i=1}^{n} |Z_i| e^{j\theta} \quad (21)$$

When "$R_i/\omega L_i = x$" is set for the angular frequency ω of an arbitrary noise current, formula (21) can be expressed as in formula (22).

$$Z = \frac{e^{j\theta}}{\sqrt{1+x^2}} \sum_{i=1}^{n} R_i \quad (22)$$

In this case, when the values of $R_i$ and $L_i$ are set to satisfy "$R_i/\omega_n L_i = x = 1$", i.e., "$R_i = \omega_n L_i$", by having ω as a prescribed noise lower limit angular frequency $\omega_n$ of the noise attenuator, formula (22) can be expressed as in formula (23).

$$Z = \frac{e^{j\frac{\pi}{4}}}{\sqrt{2}} \sum_{i=1}^{n} R_i \quad (23)$$

Since "$\omega L_i \gg R_i$" applies with the noise angular frequency higher than the set lower limit noise angular frequency, "x→0" can be obtained. Therefore, there is obtained formula (24).

$$Z \to \sum_{i=1}^{n} R_i \quad (24)$$

Now, to fix the ratio of the inductance $L_i$ ($L_1, L_2, \text{---} L_n$) of the inductor 1 to the resistance value $R_i$ ($R_1, R_2, \text{---} R_n$) of the resistance 2 quantitatively means to set the values of $R_i$ and $L_i$ to satisfy "$R_i/\omega L_i = x = 1$", i.e., "$R_1 = \omega_n L_i$", by having ω as the prescribed noise lower limit angular frequency w of the noise attenuator. Note that $R_i$ means the resistance value of the resistance $2_i$ of the i-th unit element connected in series as shown in FIG. 1B, and $L_i$ means the inductance of the inductor $1_i$ of the i-th unit element connected in series as shown in FIG. 1B.

Here, there is described an example of a case where the noise attenuator for the power source line is put into practical use. It is assumed that a ferrite toroidal coil that is unsaturated up to the current of 10 A at the most and has 0.4 mH inductance is used as the inductor 1. Provided that the effective lower limit noise frequency is 10 kHz, $R_i$ is 25Ω. If three each of the unit elements are used for the two power source lines, there is obtained "$\Sigma R_i = 150\Omega$". Further, when the effective lower-limit noise frequency is set as 50 kHz, "$R_i = 250\Omega$". Thereby, the total resistance value becomes 750Ω.

Figure 2:
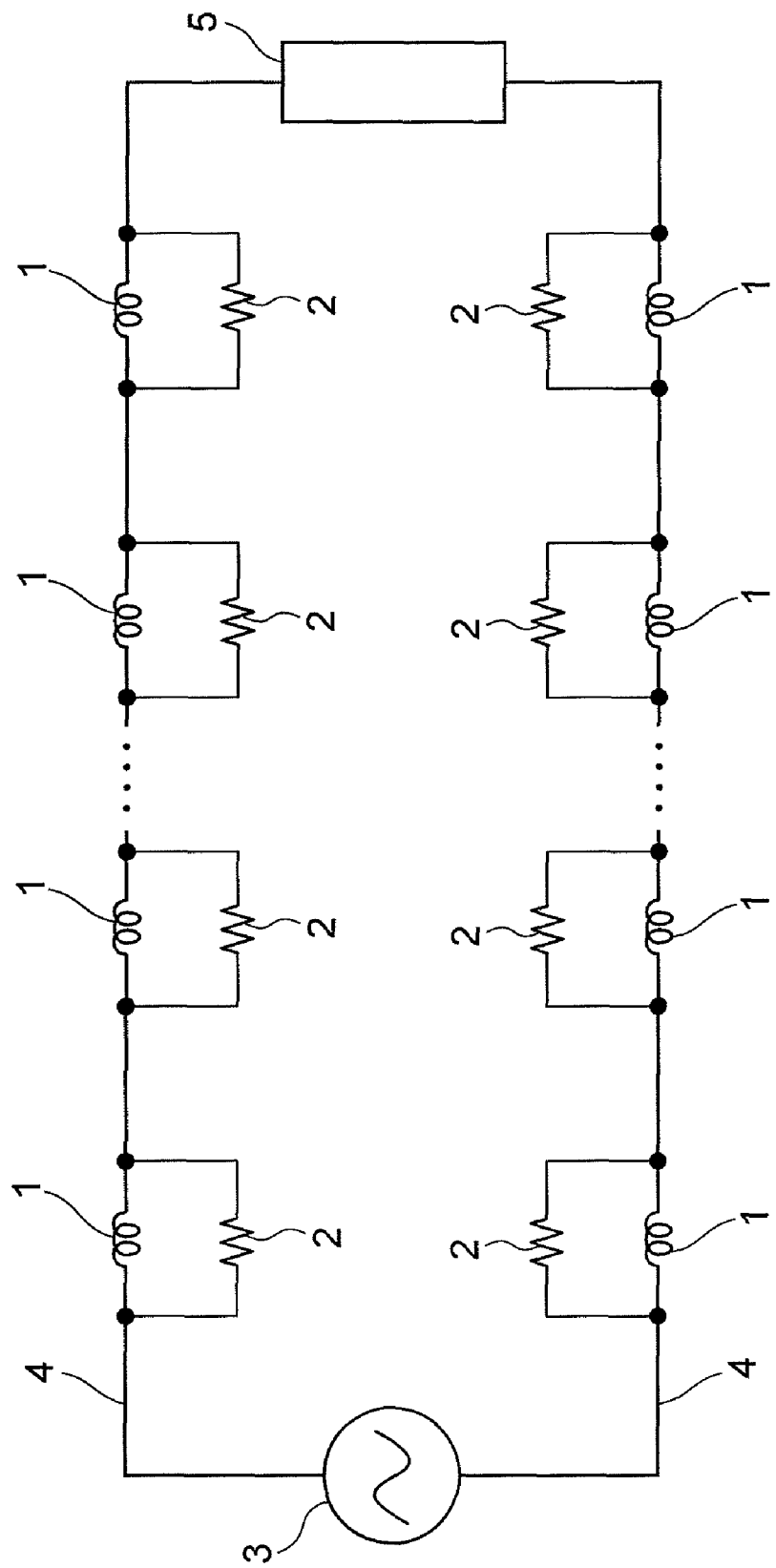
FIG. 2 is a circuit diagram in which the unit elements shown in FIG. 1A are disposed in balance to two conductor lines.

Further, as shown in FIG. 2, with the exemplary embodiment of the present invention, the circuit elements shown in FIG. 1B are connected in balance to the parallel conductor lines 4, 4 in order to be able to consume even the inverse power. Reference numeral 3 is a signal power source, and 5 is a load. While the conductor lines shown in FIG. 2 are of double-line type, the present invention is not limited only to such case. The conductor lines may be of three-line type.

The line noise attenuator according to the exemplary embodiment of the present invention is designed to power-consume the noise current superimposed on the conductor lines such as the power source lines operating as the linear antennas by using the pure resistance so as to eliminate the noise obstruction of the electronic device connected to the conductor lines. In this case, it is only required to eliminate the noise obstruction generated in the electronic device, and the resistance value of the resistance 2 in parallel to the inductor 1 should not be made larger than it is necessary. Another intended function of the line noise attenuator according to the exemplary embodiment of the present invention is to purify the noise electromagnetic environment through consuming the noise current by the resistance and reducing the re-radiated power from the conductor lines operating as the linear antennas as much as possible.

Figure 6:
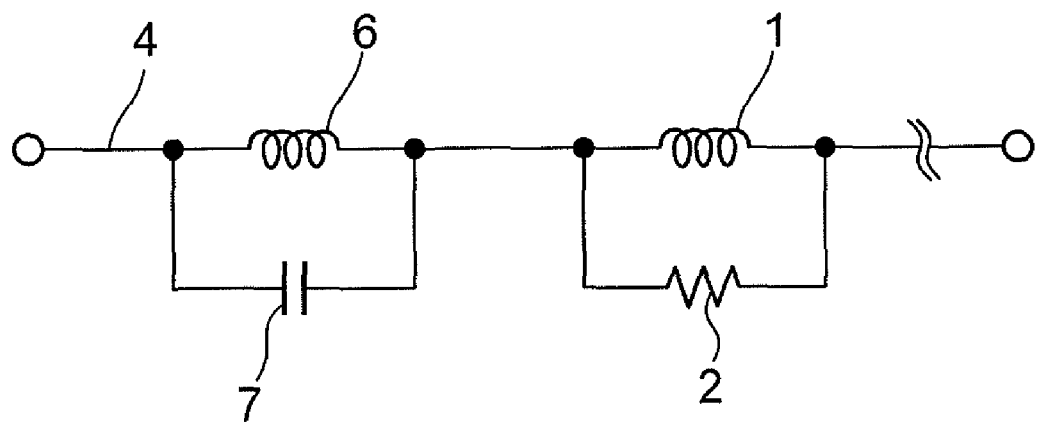
FIG. 6 is a circuit diagram showing another exemplary embodiment of the present invention.

For that, it is necessary to know the values of the impedance $Z_a$ of the conductor line 4 operating as the linear antenna shown in FIG. 6 and the impedance $Z_L$ of the load as the noise current load. It is not necessary to know the exact values of those. However, it is possible to determine the constant for the line noise attenuator by knowing the approximate values. In the followings, there is investigated a means for knowing the values of $X_a$ and $Z_L$ of the electronic device that has the noise obstruction.

FIG. 3 and FIG. 4 show examples of spectrums of actually measured noise currents measured by a clamp-type ammeter on the earth line connected to a large-scaled electronic device for determining the constant of the noise attenuator. In FIG. 3 and FIG. 4, plotted are spectrums of sample data A, B, C, D, E, and F which are obtained by actually measuring the noise currents superimposed on various kinds of earth lines placed in the electromagnetic environments. FIG. 3 and FIG. 4 show the spectrums by taking the frequency (kHz) on the horizontal axis and the current value (dBµA) on the vertical axis. FIG. 3 shows the spectrums of the sample data A, B, and C with the frequencies of 10 kHz-100 kHz, and FIG. 4 shows the spectrums of the sample data D, E, and F with the frequencies of 0.1 MHz-1 MHz. As can be seen from FIG. 3, there are various sizes of spectrums of the noise currents of 100 kHz or less, and the frequency of the noise current that is actually the factor for causing the noise obstruction is unknown. However, it is considered a common sense to pay attention to the maximum current amplitude of the noise current. Thus, in FIG. 3, the noise current of 30 kHz is investigated. In order to power-consume the noise current of 30 kHz by the line noise attenuator according to the exemplary embodiment of the present invention and to eliminate the noise obstruction of the target electronic device, it is necessary to know the extent of the impedance $Z_a$ of the conductor line 4 operating as the linear antenna and the impedance $Z_L$ of the noise obstruction load.

In order to know the impedance $Z_a$ of the conductor line 4 and the impedance $Z_L$ of the noise obstruction load, measurements are conducted by using two inductors. Assuming here that respective inductances of the two inductors are $L_1, L_2$ and that the inductance values are already known, the reactance values $X_1, X_2$ in the angular frequency of the target noise frequency current are already known.

Assuming that the current value of the noise current measured before inserting the two inductors to the conductor line 4 is $I_0$, the current value when a single inductor is inserted to the conductor line is $I_1$, and the current value when inserting the other inductor to the conductor line is $I_2$, following formulae (25), (26), and (27) apply.

$$|I_0| = \frac{|E_n|}{\sqrt{(X_a + X_L)^2 + (R_r + R_L)^2}} \quad (25)$$

$$|I_1| = \frac{|E_n|}{\sqrt{(X_a + X_L + X_1)^2 + (R_r + R_L)^2}} \quad (26)$$

$$|I_2| = \frac{|E_n|}{\sqrt{(X_a + X_L + X_2)^2 + (R_r + R_L)^2}} \quad (27)$$

Note that "$Z_a = R_r + jX_a$" and "$Z_L = R_L + jX_L$".
By solving those, there is obtained following formulae.

$$X_a + X_L = \frac{\alpha_1 X_2^2 - \alpha_2 X_1^2}{2(\alpha_2 X_1 - \alpha_1 X_2)} \quad (28)$$

$$R_r + R_L = \frac{\sqrt{4X_1 X_2(X_1 - X_2)(\alpha_1 X_2 - \alpha_2 X_1) - (\alpha_1 X_2^2 - \alpha_2 X_1^2)^2}}{2(\alpha_1 X_2 - \alpha_2 X_1)} \quad (29)$$

Note that "$X_1 > X_2$",

"$\alpha_1 = \frac{|I_0|^2 - |I_1|^2}{|I_1|^2}$", and "$\alpha_2 = \frac{|I_0|^2 - |I_2|^2}{|I_2|^2}$".

In this case, the noise current of 30 kHz is being studied. The wavelength thereof is 10 km, the length of the conductor line 4 is much shorter compared to the wavelength, and the height from the ground is short as well. Therefore, the resistance value of $R_r$ can be considered equal to or less than 10Ω. However, when several orders of mA of the noise current of several tens of kHz is flowing, the extent of the value shown with formula (28) is an issue. This is because the noise current superimposed on the conductor line 4 cannot be considered to depend on the antenna emission resistance but may be considered due to the neighborhood noise magnetic field. If so, $R_r$ can be treated as the internal resistance of an oscillator.

Figure 5A:
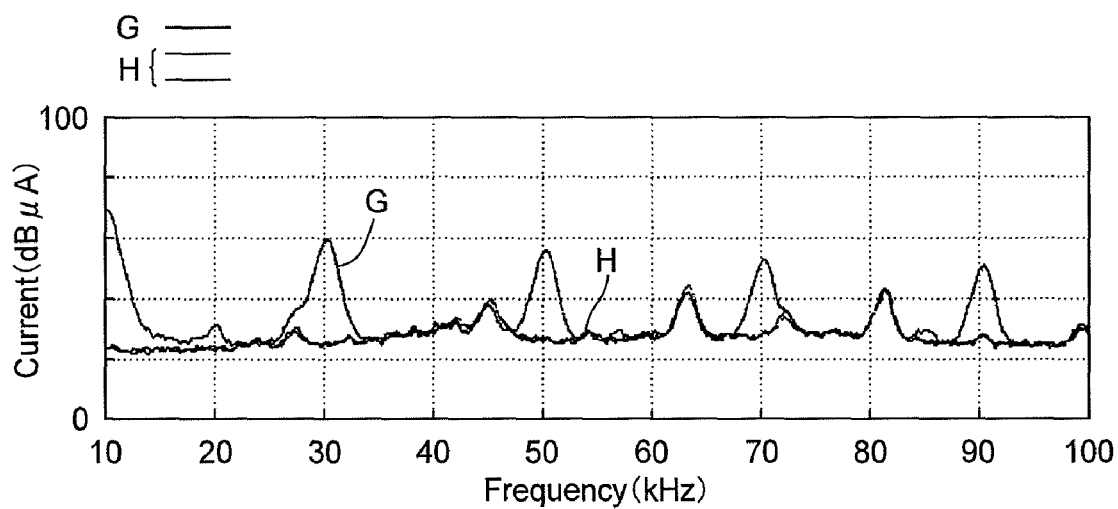
FIG. 5 shows characteristic charts showing results of making comparison between the exemplary embodiment of the present invention and a comparative example.
Figure 5B:
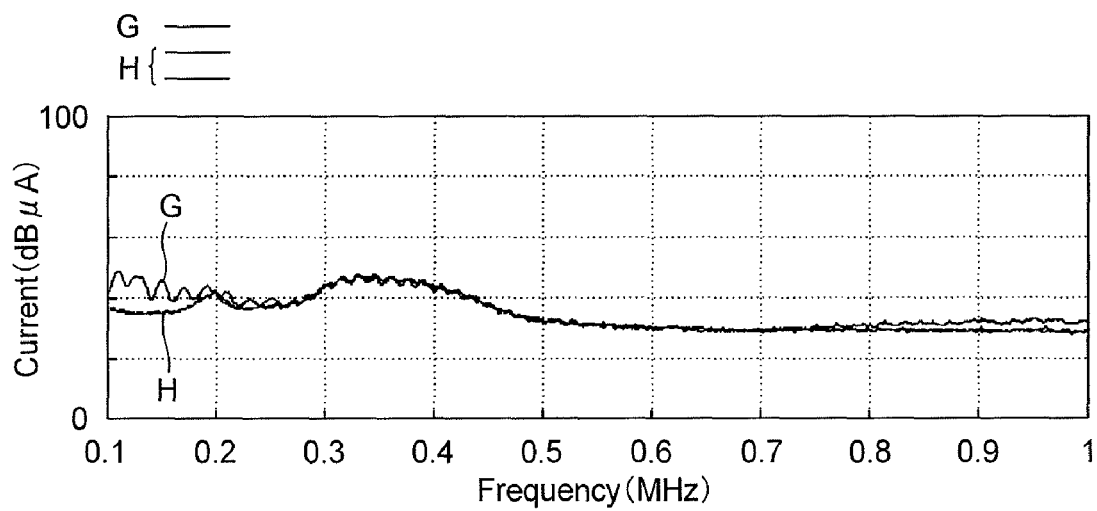

FIG. 5A and FIG. 5B show characteristic H of the case where the noise attenuator according to the exemplary embodiment of the present invention is applied and characteristic G of a comparative example where the noise attenuator is not applied. As can be seen from FIG. 5A and FIG. 5B, in the characteristic G of the comparative example, the noise is prominent at 30 kHz, 50 kHz, 70 kHz, 90 kHz, 100 kHz-200 kHz, etc. However, it can be seen that the noise is attenuated when the noise attenuator according to the exemplary embodiment of the present invention is employed. From the results of actual measurements, it is obvious that the noise attenuator according to the exemplary embodiment of the present invention is capable of purifying the noise environment.

Further, as shown in FIG. 6, the exemplary embodiment of the present invention may be structured to suppress the noise current still more effectively by disposing a parallel resonance circuit constituted with an inductor 6 and a capacitor 7 at a previous stage of the unit element constituted with the inductor 1 and the resistance 2.

With the exemplary embodiment of the present invention, it is possible with the resistance to power-consume the noise current, flown in the conductor lines for supplying the signal power to the load from the signal power source and is in non-uniform wiring modes (i.e. the noise current of the common mode and normal mode), to such a level that the noise obstructions can be suppressed without using the capacitor which induces the series resonance phenomenon. Further, it is possible to purify the electromagnetic environment through attenuating the noise current which is superimposed on the lines for supplying the power or the signal to the electronic device from the power source or the signal source.

Specifically, the noise filter disclosed in Patent Document 1 has the noise current of the normal mode detoured to the capacitor to reflect it towards the AC power source side. Thus, the noise current when flowing towards the AC power source side via the conductor is re-radiated to the surroundings from the conductor, which induces a secondary obstruction.

In the meantime, in the exemplary embodiment of the present invention, as has been investigated regarding the effects of replacing the inductor with the pure resistance, the resistance value R of the resistance is set to satisfy the relations of "$R \gg (X_a + X_L)$" and "$(R_r - R_L) \approx R$" provided that the internal impedance of the conductor line as the antenna is "$Z_a = R_r + jX_a$" and the noise obstruction load impedance of the electronic device having the noise obstruction connected to the conductor line is "$Z_l = R_L + jX_L$". Therefore, the noise current is heat-consumed by the resistance in parallel to the inductor. Thus, the power when the inverse power, i.e., the noise current, flows in the conductor can be made close to "0" as much as possible, so that the electromagnetic environment can be purified. This is the effect that cannot be achieved with the noise filter using the capacitor, such as the technique disclosed in Patent Document 1.

In Patent Document 1, an inductor is inserted to the conductor line as a measure taken for reducing the noise obstruction. Signal transmission in the conductor line such as the signal line, e.g., the power source line, can be conducted with the so-called normal mode. Conventionally, the inductor of the noise filter used for the power source line is required to use a core member having a higher responsiveness for the high frequency. However, the core member has such a shortcoming that it is likely to cause magnetic saturation at a low current value. Thus, the conventional noise filter is structured by applying two same-turn wirings to a single core to cancel magnetic fluxes with each other by reciprocating currents in order to avoid magnetic saturation. Therefore, the inductor of this case is effective only for the common mode noise current, and no measure is taken for the normal mode.

The line noise attenuator according to the exemplary embodiment of the present invention is structured to be effective for consuming the noise power and suppressing the noise current in both common and normal modes. However, an issue generated when inserting it to the signal line, particularly the power source line, is that magnetic saturation of the core member gives the limit to the effective current value.

Thus, in the line noise attenuator according to the exemplary embodiment of the present invention, two or more inductors are cascade-connected, and the resistance is connected in parallel to each of the cascade-connected inductors. Specifically, in the exemplary embodiment of the present invention, as shown in FIG. 1B, the number of windings in a single core is suppressed to the limit turn number with which magnetic saturation occurs at a prescribed signal current value, the element obtained by combining the resistance 2 in parallel to the inductor 1 is taken as a unit element, the unit elements are cascade-connected, and a value obtained by adding the inductance values of the number of cascade-connected inductors is taken as the total inductance value. This makes it possible to suppress generation of magnetic saturation with a prescribed current of the power source line or the like. Therefore, it is possible to avoid the magnetic saturation phenomenon that is generated with the technique of Patent Document 2, so that the issues caused by inserting the resistance to the power source line can be overcome.

It is possible to avoid the magnetic saturation by cascade-connecting the two or more inductors. However, the use of the inductor obtained by applying wirings to a closed magnetic path forming core having a gap can improve the anti magnetic saturation property further.

Moreover, in the case where the ratio between the inductance of the inductor and the resistance value of the resistance is fixed quantitatively and the inductor and the resistance are provided to the conductor line, the noise current can be guided to the resistance connected in parallel without having it flown to the inductor through satisfying the relation of "$R_i = \omega_n L_i$" where the inductance of the i-th cascade-connected inductor is $L_i$, the resistance value of the resistance is $R_i$, the noise lower limit angular frequency set in the line noise attenuator is $\omega_n$. Therefore, the noise current can be heat-consumed by the resistance.

Further, the inverse power can be brought close to "0" through setting the resistance value R of the resistance to satisfy the relation of "$R \gg R_r$" and "$R \gg |X_a + X_L|$" provided that the internal impedance of the conductor line as the antenna is "$Z_a = R_r + jX_a$" and the noise obstruction load impedance of the electronic device having noise obstruction connected to the conductor line is "$Z_l = R_L + jX_L$".

Further, it is possible to know the extent of the impedance of the conductor line and the impedance of the noise obstruction load through performing calculations based on Expression (30)

$$X_a + X_L = \frac{\alpha_1 X_2^2 - \alpha_2 X_1^2}{2(\alpha_2 X_1 - \alpha_1 X_2)} \quad (30)$$

and Expression (31)

$$R_r + R_L = \frac{\sqrt{4X_1 X_2 (X_1 - X_2)(\alpha_1 X_2 - \alpha_2 X_1) - (\alpha_1 X_2^2 - \alpha_2 X_1^2)^2}}{2(\alpha_1 X_2 - \alpha_2 X_1)} \quad (31)$$

assuming that the current value of the noise current measured before inserting the inductors to the conductor line is $I_0$, the current value when a single inductor is inserted to the conductor line is $I_1$, and the current value when inserting the other inductor to the conductor line is $I_2$. This makes it possible to correspond to different electromagnetic environments uniformly.

Furthermore, the inductor and the resistance as a pair are connected in balance to the two conductor lines. This makes it possible to result in power-consuming the noise current superimposed on the conductor line such as the power source line operating as the linear antenna by a unit of conductor line by using the pure resistance. Therefore, the noise obstruction of the electronic device connected to the conductor line can be eliminated. Further, through consuming the noise current by the unit of conductor line by using the resistance and decreasing the re-radiated power from the conductor line working as the linear antenna as much as possible, it is possible to purify the noise electromagnetic environment.

The present invention is capable of purifying the electromagnetic environment through attenuating the noise current superimposed on the lines for supplying the power or the signal to the electronic device from the power source or the signal source, so that malfunctions of the electronic device and the like can be improved.

What is claimed is:

1. A line noise attenuator for purifying an electromagnetic environment by attenuating a noise current superimposed on a conductor line which supplies a signal power to a load from a low frequency signal power source, the conductor line operating as an antenna which transmits and/or receives a high frequency noise current, the attenuator comprising:
an inductor with inductance value of L for tolerating flows of a low frequency signal power; and a parallel resistor with a resistance value of R to change the high frequency noise current to heat and to consume the heat, R being set relative to a reactance value of the inductor at an angular frequency of the noise current, such that the high frequency noise current blocked at the inductor can flow, wherein
if an internal impedance of the conductor line as the antenna is "$Z_a = R_r + jX_a$", a noise obstruction load impedance of the electronic device having noise obstruction connected to the conductor line is "$Z_l = R_L + jX_L$", a noise lower limit angular frequency set in the line noise attenuator is $\omega_n$, and "$\omega_n L \gg R$", then an impedance value of the inductor is approximately equal to a pure resistance, and
a ratio between the inductance value of the inductor and the resistance value of the parallel resistor is fixed, and the inductor and the parallel resistor are provided to the conductor line.

2. The line noise attenuator as claimed in claim 1, wherein the resistance value R of the parallel resistor is set to satisfy relations of "$R \gg R_r$" and "$R \gg |X_a + X_L|$".

3. The line noise attenuator as claimed in claim 1, wherein, two or more of the inductors are cascade-connected, and the parallel resistor is connected in parallel to each of the cascade-connected inductors, and when a current value of the noise current measured before inserting the inductors to the conductor line is $I_0$, the current value when a single inductor is inserted to the conductor line is $I_1$, and the current value when inserting the other inductor to the conductor line is $I_2$, "$X_a + X_L$" and "$R_r + R_L$" can be calculated based on following formulae $$X_a + X_L = \frac{\alpha_1 X_2^2 - \alpha_2 X_1^2}{2(\alpha_2 X_1 - \alpha_1 X_2)}$$

$$R_r + R_L = \frac{\sqrt{4 X_1 X_2 (X_1 - X_2)(\alpha_1 X_2 - \alpha_2 X_1) - (\alpha_1 X_2^2 - \alpha_2 X_1^2)^2}}{2(\alpha_1 X_2 - \alpha_2 X_1)}$$

where $R_r$ is treated as internal resistance of an oscillator, $X_1 > X_2$, $$\alpha_1 = \frac{|I_0|^2 - |I_1|^2}{|I_1|^2}, \text{ and } \alpha_2 = \frac{|I_0|^2 - |I_2|^2}{|I_2|^2}.$$

* * * * *